(12) United States Patent
Maeda et al.

(10) Patent No.: US 8,586,262 B2
(45) Date of Patent: Nov. 19, 2013

(54) TITANIUM-BASED MATERIAL, METHOD OF MANUFACTURING TITANIUM-BASED MATERIAL, AND FUEL CELL SEPARATOR

(75) Inventors: Kuroudo Maeda, Aichi-ken (JP); Takashi Iseki, Aichi-ken (JP); Yuka Yamada, Toyota (JP); Kazuyuki Nakanishi, Seto (JP)

(73) Assignee: Toyota Jidosha Kabushiki Kaisha, Toyota-shi, Aichi-ken (JP)

( * ) Notice: Subject to any disclaimer, the term of this patent is extended or adjusted under 35 U.S.C. 154(b) by 0 days.

(21) Appl. No.: 13/256,490

(22) PCT Filed: Mar. 18, 2010

(86) PCT No.: PCT/IB2010/000561
§ 371 (c)(1),
(2), (4) Date: Sep. 14, 2011

(87) PCT Pub. No.: WO2010/119313
PCT Pub. Date: Oct. 21, 2010

(65) Prior Publication Data
US 2012/0088185 A1     Apr. 12, 2012

(30) Foreign Application Priority Data
Apr. 15, 2009    (JP) .................. 2009-099094

(51) Int. Cl.
  *H01M 2/16*    (2006.01)
  *B32B 15/04*   (2006.01)
  *B32B 5/00*    (2006.01)
  *B21C 23/21*   (2006.01)

(52) U.S. Cl.
  USPC ............... 429/516; 72/46; 428/457; 428/336

(58) Field of Classification Search
  USPC ................ 429/516; 72/46; 428/457, 336
  See application file for complete search history.

(56) References Cited

U.S. PATENT DOCUMENTS

| | | | |
|---|---|---|---|
| 2002/0192527 A1* | 12/2002 | Seido et al. | 429/34 |
| 2008/0160390 A1 | 7/2008 | Nakata | |
| 2009/0087558 A1* | 4/2009 | Aoyama et al. | 427/228 |

FOREIGN PATENT DOCUMENTS

| | | | |
|---|---|---|---|
| JP | 10-255823 | | 9/1998 |
| JP | 10255823 A | * | 9/1998 |
| JP | 2000-8155 | | 1/2000 |
| JP | 2000008155 A | * | 1/2000 |
| JP | 2000-182640 | | 6/2000 |
| JP | 2002-358974 | | 12/2002 |
| JP | 2002-367434 | | 12/2002 |
| JP | 2003-236604 | | 8/2003 |
| JP | 2003236604 A | * | 8/2003 |

(Continued)

OTHER PUBLICATIONS

"Carbon." Wikipedia. Wikimedia Foundation, Web, Mar. 20, 2013.*

(Continued)

*Primary Examiner* — Carlos Barcena
*Assistant Examiner* — Michael Dignan
(74) *Attorney, Agent, or Firm* — Finnegan, Henderson, Farabow, Garrett & Dunner, LLP

(57) ABSTRACT

A method of manufacturing a titanium-based material includes: rolling a titanium base material via rolling oil that includes carbon to form a rolling-altered layer that includes titanium carbide on a surface of the base material; and depositing a carbon film on the surface on which the rolling-altered layer has been formed.

3 Claims, 9 Drawing Sheets

(56) References Cited

FOREIGN PATENT DOCUMENTS

| | | | | |
|---|---|---|---|---|
| JP | | 2004-185998 | | 7/2004 |
| JP | | 2007-165275 | | 6/2007 |
| JP | | 2008004540 | A * | 1/2008 |
| WO | WO 2007/119842 | A1 | | 10/2007 |
| WO | WO 2007119842 | A1 | * | 10/2007 |
| WO | WO 2007/138436 | A2 | | 12/2007 |
| WO | WO 2007138436 | | * | 12/2007 |
| WO | WO 2007138436 | A2 | * | 12/2007 |

OTHER PUBLICATIONS

Silva, S.R.P., Ed., Properties of Amorphous Carbon, INSPEC, Short Run Press Ltd., 2003, p. 4.*
International Search Report in International Application No. PCT/IB2010/000561; Mailing Date: Aug. 25, 2010.
Written Opinion of the International Searching Authority in International Application No. PCT/IB2010/000561; Mailing Date: Aug. 25, 2010.
Notification of Reason(s) for Refusal in Japanese Patent Application No. 2009-099094; Drafting Date: Jun. 17, 2011.

* cited by examiner

FILM DENSITY:1.7g/cm³

FILM DENSITY:1.7g/cm³

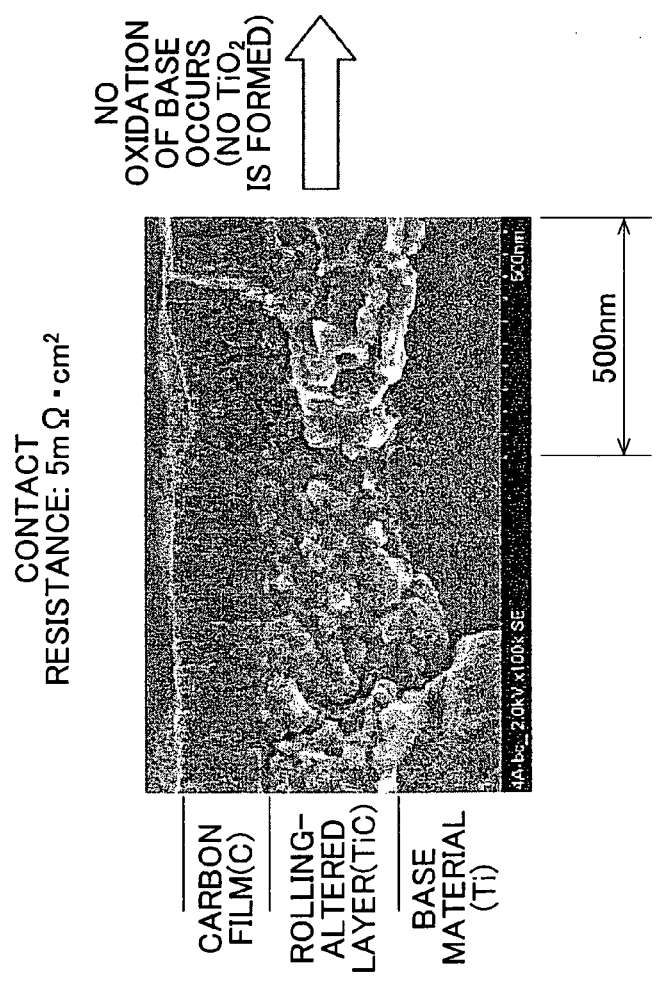

TITANIUM-BASED MATERIAL, METHOD OF MANUFACTURING TITANIUM-BASED MATERIAL, AND FUEL CELL SEPARATOR

CROSS-REFERENCE TO RELATED APPLICATIONS

This application is a national phase application of International Application No. PCT/IB2010/000561, filed Mar. 18, 2010, and claims the priority of Japanese Application No. 2009-099094, filed Apr. 15, 2009, the contents of both of which are incorporated herein by reference.

BACKGROUND OF THE INVENTION

1. Field of the Invention

The invention relates to a titanium-based material that is formed so that a highly conductive film is formed on a surface of a base material made of titanium or titanium alloy. Specifically, the invention relates to a titanium-based material that is able to ensure adhesion of the film, a method of manufacturing the titanium-based material, and a fuel cell separator made of a titanium-based material.

2. Description of the Related Art

A polymer electrolyte fuel cell that uses an electrolyte membrane is operable at low temperatures, and may be reduced in size and weight. Therefore, application of the polymer electrolyte fuel cell to a mobile unit, such as an automobile, has been studied. Particularly, a fuel-cell vehicle equipped with a polymer electrolyte fuel cell attracts social interest as an ecology car.

As shown in FIG. 10, such a polymer electrolyte fuel cell includes a membrane electrode assembly (MEA) 95 as a major component, and the MEA 95 is held between separators 96 each having a fuel (hydrogen) gas flow passage and an air gas flow passage. By so doing, one fuel cell 90 called a single cell is formed. The membrane electrode assembly 95 has a structure such that an anode electrode (anode catalyst layer) 93a is stacked on one side of an electrolyte membrane 91, which is an ion exchange membrane, and a cathode electrode (cathode catalyst layer) 93b is stacked on the other side of the electrolyte membrane 91. The anode catalyst layer 93a includes a gas diffusion layer 94a. The cathode catalyst layer 93b includes a gas diffusion layer 94b.

A titanium-based material may be used as the material of the separator of a fuel cell. The above material has a passivation oxide film on its surface layer. The oxide film is anticorrosive under a general environment, so it is desirable to use the oxide film as the material of the separator. The separator of a fuel cell is energized during power generation of the fuel cell. However, because of the oxide film, there is a possibility that contact resistance increases and, therefore, conductivity to the separator is impaired. This results in a decrease in the power generation characteristic of the fuel cell. Then, a carbon film is formed (deposited) on the surface of a titanium base material (base material made of titanium) to ensure the conductivity of the separator.

Incidentally, the thickness of such a titanium base material is adjusted by rolling. During the rolling, a TiCx layer (rolling-altered layer) is formed on the surface of the titanium base material because of rolling oil. The rolling-altered layer easily corrodes, so it may deteriorate the anticorrosion property of the titanium base material. Then, when a titanium base material is rolled, generally, a rolling-altered layer is removed from the titanium base material, and a carbon film is deposited on the surface from which the rolling-altered layer has been removed.

However, when a carbon film is deposited on the surface of the titanium base material, the adhesion of the carbon film is not so good, so there is a possibility of peeling, or the like, of the carbon film. In view of the above, there is proposed, for example, a titanium-based material that is formed so that a transition metal element, such as Ti and Zr, or a metalloid element, such as Si and B, is formed as an intermediate layer between an oxide film of a base material and a carbon film (see, for example, Japanese Patent Application Publication No. 2004-185998 (JP-A-2004-185998)). By forming the above intermediate layer, it is possible to improve the adhesion between the titanium base material and the carbon film.

However, when a titanium-based material is manufactured as in the case of JP-A-2004-185998, it is necessary to deposit the intermediate layer on the surface of the titanium base material before the carbon film is formed. This increases a manufacturing process and may lead an increase in manufacturing cost. In addition, depending on selection of the material that constitutes the intermediate layer, the adhesion may not be sufficiently ensured, so it is not reliable enough.

SUMMARY OF THE INVENTION

The invention provides a titanium-based material on which a low-cost carbon film having a high adhesion strength may be formed without increasing a manufacturing process, and also provides a method of manufacturing the titanium-based material.

The inventors have studied and have an idea that, when a carbon film is formed on the surface of the titanium base material, a layer that includes both titanium and carbon is desirable as the intermediate layer. The inventors focused attention on the rolling-altered layer that is formed on the surface of the base material as a layer that includes the above components in a rolling process for regulating the thickness of the above described titanium. The rolling-altered layer is a layer that is chemically or mechanically altered from the titanium base material during rolling, and is a layer that includes titanium carbide (TiCx) and that has asperities on its surface. Therefore, the inventors found that, when the carbon film is deposited on the above layer, it is possible to improve the adhesion with the carbon film.

A first aspect of the invention provides a method of manufacturing a titanium-based material. The method includes: rolling a titanium base material via rolling oil that includes carbon to form a rolling-altered layer that includes titanium carbide on a surface of the base material; and depositing a carbon film on the surface on which the rolling-altered layer has been formed.

With the first aspect, by performing rolling via the rolling oil that includes carbon, the rolling-altered layer is formed on the surface of the base material by energy during rolling (energy that heats the base material, energy due to rolling heat generated during rolling, or the like). The rolling-altered layer is a layer that includes titanium carbide that is obtained by the reaction between the carbon of the rolling oil and the titanium of the base material, and asperities are formed on the surface of the layer.

By forming the carbon film on the surface of the above rolling-altered layer, the rolling-altered layer serves as an intermediate layer that includes titanium carbide. Therefore, the rolling-altered layer has an affinity for the carbon of the carbon film, and, because of the asperities of the surface of that layer, it is possible to exhibit anchor effect to the carbon film. In addition, the rolling-altered layer is a layer that part of the base material is altered, so the adhesion of the rolling-altered layer to the base material is also high.

Furthermore, the rolling-altered layer is incidentally formed at the time of rolling for regulating the thickness of the titanium base material, so no deposition process for forming an intermediate layer as an adhesive layer is required, and no additional manufacturing cost is required. As a result, the method of manufacturing a titanium-based material according to the first aspect is able to improve the adhesion of the carbon film of the titanium-based material at low cost as compared with another manufacturing method.

The "rolling-altered layer" in the first aspect is a layer that part of the surface layer of the titanium base material is altered when the titanium base material is rolled by rolling rollers, or the like, and is a layer that is at least chemically altered from the titanium base material. In some cases, the "rolling-altered layer" may be a layer that includes a microscopically altered metal structure as compared with the metal structure of the base material.

In the first aspect, the carbon film may be deposited so that the bulk density of the carbon film ranges from 1.6 g/cm$^3$ to 2.2 g/cm$^3$ and a contact resistance between the carbon film and carbon paper is lower than or equal to 15 mΩ·cm$^2$ when the carbon film and the carbon paper are pressed at a contact pressure of 1 MPa.

By forming the carbon film so as to have a bulk density of the above range, it is possible to obtain a titanium-based material having a further low contact resistance and suitable for a separator of a fuel cell, or the like. That is, when the bulk density of the carbon film is lower than 1.6 g/cm$^3$, the carbon film itself has a porous structure. Therefore, under corrosive environment, water, or the like, penetrates through the carbon film and then the titanium carbide of the rolling-altered layer is altered (corroded) into titanium oxide, so the contact resistance may increase. On the other hand, in order to improve the conductivity of the carbon film, it is necessary to include a graphite structure formed of sp2 carbon. Therefore, when the bulk density of the carbon film exceeds 2.2 g/cm$^3$, the diamond structure of the carbon film formed of sp3 carbon increases, and the contact resistance of the carbon film increases. In addition, according to the experimental results of the inventors, which will be described later, when carbon paper is placed on the surface of the carbon film having a bulk density of the above range and then the carbon film and the carbon paper are pressed at a contact pressure of 1 MPa, the contact resistance between the carbon film and the carbon paper is lower than or equal to 15 mΩ·cm$^2$, so it is possible to further improve the electroconductive characteristic of the carbon film.

In the first aspect, the carbon film may be deposited by plasma CVD. With the first aspect, plasma CVD is a method in which a carbon film is deposited by reaction gas, so throwing power of carbon is high. Therefore, it is possible to uniformly deposit the carbon film irrespective of the shape of the base material. Furthermore, it is possible to desirably deposit the carbon film having a bulk density of the above described range. In addition, because gas is used to deposit the carbon film, a deposition system has a simple structure with low cost. Furthermore, in order to form the amorphous carbon film that includes a large amount of graphite structure, deposition may be performed at a high pressure at a low temperature ranging from room temperature to 600° C.

A second aspect of the invention provides a titanium-based material. The titanium-based material includes: a titanium base material; a rolling-altered layer that includes titanium carbide and that is formed on a surface of the base material; and a carbon film that is formed on a surface of the rolling-altered layer.

With the second aspect, as described above, the rolling-altered layer that includes titanium carbide serves as an intermediate layer between the titanium base material and the carbon film, so an affinity between the titanium carbide and the carbon of the carbon film is high. Therefore, it is possible to improve the adhesion of the carbon film. In addition, the rolling-altered layer is a layer that part of the base material is altered by rolling, so adhesion between the rolling-altered layer and the base material is also high.

In the titanium-based material according to the second aspect, the bulk density of the carbon film may range from 1.6 g/cm$^3$ to 2.2 g/cm$^3$, and a contact resistance between the carbon film and carbon paper may be lower than or equal to 15 mΩ·cm$^2$ when the carbon film and the carbon paper are pressed at a contact pressure of 1 MPa.

With the second aspect, by setting the bulk density to fall within the above range, it is possible to decrease the contact resistance of the titanium-based material. That is, as in the case of the above description, when the bulk density of the carbon film is lower than 1.6 g/cm$^3$, the carbon film has a porous structure, so the base material easily corrodes; whereas, when the bulk density of the carbon film exceeds 2.2 g/cm$^3$, the structure of the carbon film is approximate to a diamond structure and, therefore, the contact resistance increases. In addition, with the carbon film having a bulk density of the above range, the contact resistance between the carbon film and the carbon paper is lower than or equal to 15 mΩ·cm$^2$, so it is possible to further improve the electroconductive characteristic.

In the titanium-based material according to the second aspect, the carbon film may be an amorphous carbon film. With the second aspect, by forming the carbon film as the amorphous carbon film, the film has an amorphous structure (includes sp2 carbon and sp3 carbon), so it is desirably possible to ensure both the strength of the film and the conductivity of the film.

Here, the bulk density described in the aspects of the invention is a value obtained by dividing the mass of the deposited carbon film by the volume of the carbon film. The mass of the carbon film may be calculated from a difference in weight between the base material on which no carbon film is deposited and the base material on which the carbon film is deposited, and the volume of the carbon film may be calculated from the thickness and surface area of the carbon film.

A fuel cell separator may include the titanium-based material manufactured according to the above described method or the above described titanium-based material. A fuel cell separator generally has a surface that partially contacts with an electrode (diffusion layer laminated on a catalyst layer) laminated in a solid electrolyte to define a gas passage between the electrode and the separator. Then, the above described fuel cell separator may have a carbon film formed on at least a surface that contacts with the electrode within a surface of the titanium-based material at least facing the electrode.

The thus configured fuel cell separator allows a carbon film to be deposited at low cost, can ensure the conductivity of the separator, and suppresses corrosion of the base material, which becomes a base of the carbon film, under corrosive environment at the time of usage of the fuel cell, so it is possible to suppress an increase in contact resistance due to alteration over time.

With the titanium-based material according to the aspects of the invention, it is possible to deposit a low-cost carbon film having a high adhesion strength without increasing a manufacturing process.

BRIEF DESCRIPTION OF THE DRAWINGS

The foregoing and further objects, features and advantages of the invention will become apparent from the following description of example embodiments with reference to the accompanying drawings, wherein like numerals are used to represent like elements and wherein:

FIG. 1A and FIG. 1B show the overall configuration diagram of a method of manufacturing a titanium-based material according to an embodiment of the invention, in which FIG. 1A is a view that illustrates a process of forming a rolling-altered layer and FIG. 1B is a view that illustrates a process of depositing a carbon film;

FIG. 6A and FIG. 6B are photographs of the surfaces of the test pieces after being subjected to constant-potential corrosion test, in which FIG. 6A is a photograph according to Example 1 and FIG. 6B is a photograph according to Comparative example 1;

FIG. 8A shows a photograph of the cross section of a titanium-based material having a bulk density of 1.7 g/cm$^3$ of an amorphous carbon film before being subjected to constant-potential corrosion test according to Example 2, and FIG. 8B is a photograph of the cross section of the titanium-based material after being subjected to constant-potential corrosion test;

DETAILED DESCRIPTION OF EMBODIMENTS

Figure 1A:
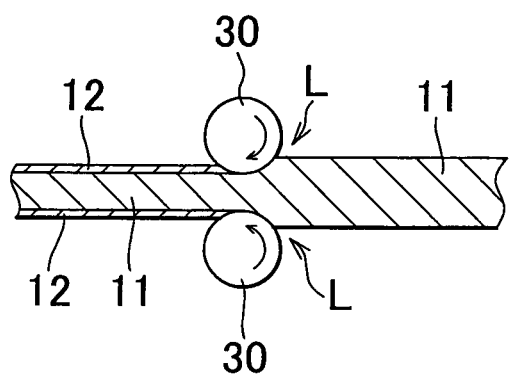
Figure 1B:
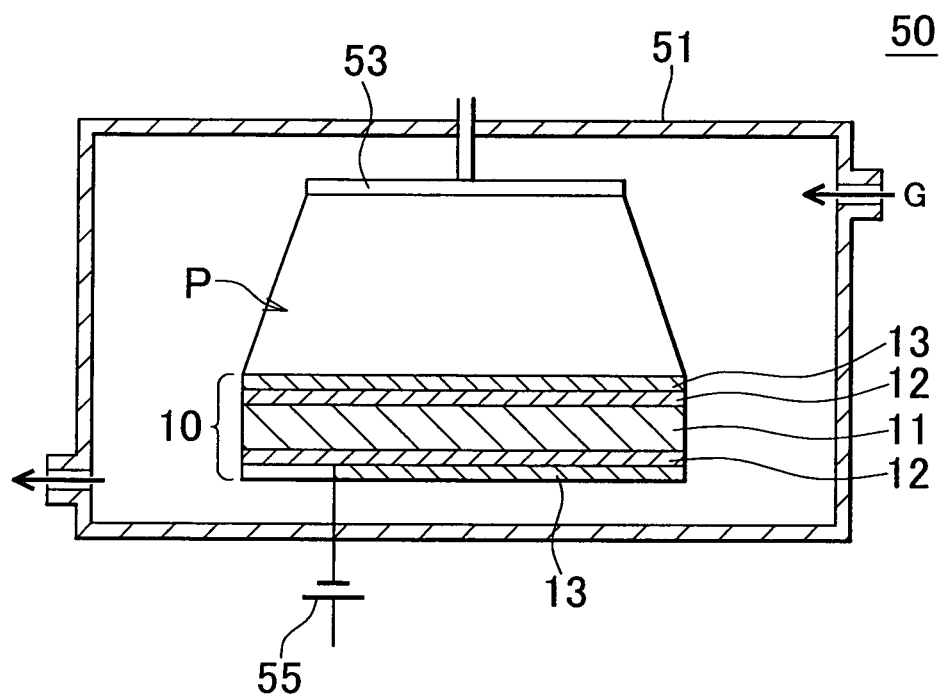
Figure 2:
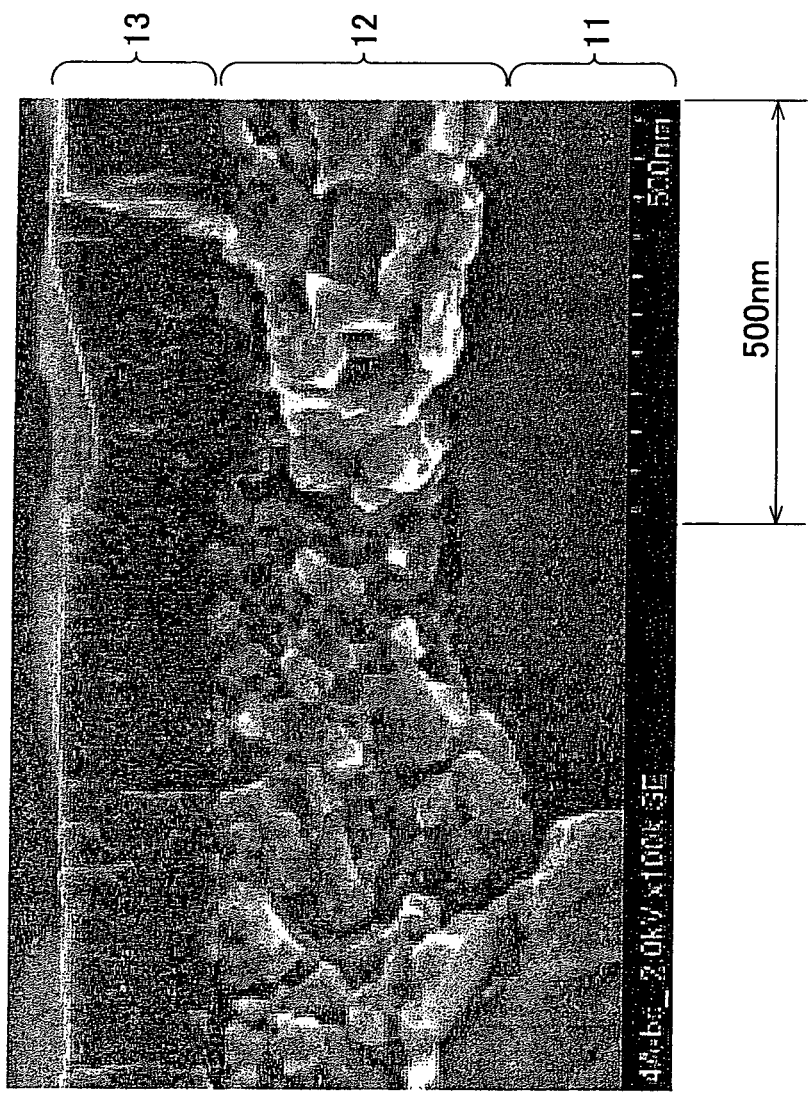
FIG. 2 is a photograph of the titanium-based material manufactured by the method shown in FIG. 1A and FIG. 1B.

Hereinafter, a method of manufacturing a titanium-based material according to an embodiment of the invention will be described with reference to the accompanying drawings. FIG. 1A and FIG. 1B show the overall configuration diagram of the method of manufacturing a titanium-based material according to the embodiment of the invention. FIG. 1A is a view that illustrates a process of forming a rolling-altered layer. FIG. 1B is a view that illustrates a process of depositing a carbon film. In addition, FIG. 2 is a photograph of the titanium-based material manufactured by the method shown in FIG. 1A and FIG. 1B.

As shown in FIG. 1A and FIG. 1B, the method of manufacturing a titanium-based material according to the present embodiment is, for example, suitable for a separator for a polymer electrolyte fuel cell. First, as shown in FIG. 1A, a titanium base material made of titanium or titanium alloy is prepared, and the base material 11 is subjected to rolling until the base material 11 has a desired thickness in order to use the base material 11 as a separator. Specifically, the base material 11 is transported to between a pair of rolling rollers 30, and rolling oil L that includes carbon is flowed to between the base material 11 and the rolling rollers 30. Then, because of energy of rolling heat generated during rolling (heat energy of the base material 11 heated during hot rolling), titanium in the surface layer of the base material 11 reacts with carbon in the rolling oil L to produce titanium carbide, and a rolling-altered layer 12 that includes titanium carbide is formed in the surface layer.

A rolling method may be any of hot rolling and cold rolling. As long as the rolling-altered layer 12 that includes titanium carbide is formed on the surface of the base material 11, the rolling method is not limited.

In addition, the thickness of the rolling-altered layer 12 desirably ranges from 100 nm to 20000 nm. The thickness of the rolling-altered layer 12 may be regulated by appropriately selecting the temperature at which the base material is heated during rolling, additive agent included in the rolling oil, or the like. Then, when the thickness is smaller than 100 nm, it is not sufficient to bring an amorphous carbon film 13 into contact as an intermediate layer. On the other hand, it is difficult to form a rolling-altered later having a thickness above 20000 nm by rolling.

Subsequently, a carbon film is deposited on the titanium-based material on which the rolling-altered layer 12 has been formed. Specifically, as shown in FIG. 1B, the titanium-based material on which the rolling-altered layer 12 has been formed is put into a chamber 51 of a plasma CVD device 50, and then the inside of the chamber 51 is evacuated. Then, gas G composed of hydrocarbon reaction gas and carrier gas, which is inert gas, is introduced from the outside of the chamber 51, the concentration of the reaction gas is regulated, and the pressure in the chamber 51 is regulated. After that, a power supply 55 is connected to the titanium-based material to generate plasma P between an electrode 53 and the titanium-based material through electrical discharge, while adjusting the power supply 55 to a predetermined voltage. Thus, the amorphous carbon film 13 is deposited on the surface of the rolling-altered layer 12 by plasma CVD.

The above plasma CVD may, for example, include high-frequency plasma CVD that utilizes high-frequency discharge, microwave plasma CVD that utilizes microwave discharge and direct current plasma CVD that utilizes direct-current discharge. Among others, the direct current plasma CVD is desirable. According to the direct current plasma CVD, it is only necessary that a deposition device is formed of a vacuum chamber and a direct-current power supply, so it is possible to easily deposit a film on base materials of various shapes.

In addition, the pressure of an atmosphere in the chamber 51 is desirably higher than or equal to 5 Pa and lower than or equal to 1000 Pa, and more desirably higher than or equal to 300 Pa and lower than or equal to 800 Pa. When the deposition pressure is increased, the concentration of reaction gas increases. By so doing, it is possible to form a thick film at a high deposition rate and at a practical speed.

In addition, the reaction gas is desirably a cyclic compound. A carbocyclic compound that includes sp2 carbon, that is, a carbocyclic compound that includes a carbon-carbon double bond, may be not only an aromatic hydrocarbon compound, such as benzene, toluene, xylene and naphthalene, but also cyclohexene, or the like. By using the above reaction gas, it is possible to deposit a highly conductive carbon film that includes sp2 carbon.

The carrier gas may be hydrogen gas and inert gas, such as argon gas, as described above. It is only necessary that the types and flow rate ratio of the reaction gas and the carrier gas are appropriately selected so that the obtained amorphous carbon film has a desired composition and bulk density.

In addition, by regulating the applied voltage, the pressure in the chamber 51, and the like, it is also possible to regulate the bulk density of the amorphous carbon film 13 to be deposited. In the present embodiment, as is apparent from the experimental results (Examples), which will be described later, of the inventors, the bulk density of the amorphous carbon film 13 desirably ranges from 1.6 g/cm$^3$ to 2.2 g/cm$^3$. When a carbon film having a bulk density of the above range and carbon paper are pressed at a contact pressure of 1 MPa, the contact resistance between the carbon film and the carbon paper is lower than or equal to 15 mΩ·cm$^2$.

Note that the bulk density of the amorphous carbon film 13 is obtained as follows. Specifically, the mass of the base material 11 on which no amorphous carbon film 13 is deposited is measured in advance, and the weight of the base material 11 on which the amorphous carbon film 13 coats (is deposited on) the surface of the base material 11, and then the mass of the amorphous carbon film 13 is calculated from a difference in mass between the base material 11 on which no carbon film 13 is deposited and the base material 11 on which the carbon film 13 is deposited. Subsequently, a scanning electron microscope (SEM), or the like, is used to measure the thickness of the amorphous carbon film 13, and then the volume of the amorphous carbon film 13 is calculated from the surface area and thickness of the amorphous carbon film 13. Then, the density (bulk density) of the amorphous carbon film 13 is calculated from the mass of the amorphous carbon film 13 and the volume of the amorphous carbon film 13. Alternatively, the bulk density of the amorphous carbon film 13 may be obtained in such a manner that the film is physically peeled off and the peeled film is measured using a micromeritics gas pycnometer (Accupyc II1340 produced by Shimadzu Corporation).

The surface temperature (deposition temperature) of the base material during deposition of the amorphous carbon film 13 is not specifically limited; however, the surface temperature is desirably higher than or equal to room temperature and lower than or equal to 600° C. As the deposition temperature increases, the content of hydrogen in the amorphous carbon film 13 is reduced, so the conductivity improves. However, as the deposition temperature is excessively high, the residual stress of the base material may deform the base material 11 and, furthermore, the compactness of the film decreases to thereby cause the base material 11 to easily corrode.

The thickness of the amorphous carbon film 13 more desirably ranges from 10 nm to 1000 nm. That is, when the thickness of the amorphous carbon film 13 is smaller than 10 nm, it is difficult to form a compact film, so water easily penetrates into the film. On the other hand, when the thickness of the amorphous carbon film 13 exceeds 1000 nm, internal stress occurs in the amorphous carbon film 13, so the film may easily develop cracks.

In the present embodiment, by depositing the amorphous carbon film 13 using hydrocarbon gas by plasma CVD, not only it is possible to deposit the amorphous film 13 at low cost but also, because of the high throwing power of carbon, it is possible to desirably deposit the amorphous film 13 on the surface of the base material (rolling-altered layer 12) even when the base material has a complex surface shape.

Note that, in the present embodiment, the method of depositing the amorphous carbon film 13 is chemical vapor deposition using plasma (plasma CVD); however, as long as it is possible to ensure the bulk density of the amorphous carbon film, physical vapor deposition (PVD) that utilizes, for example, vacuum deposition, sputtering, ion plating, and the like, may be used for deposition. Then, when deposition is performed by PVD with a bias voltage, by setting the magnitude of the bias voltage at a predetermined voltage, it is possible to regulate the bulk density of the amorphous carbon film.

In this way, by depositing the amorphous carbon film 13, the titanium-based material as shown in FIG. 2 is manufactured. Specifically, the manufactured titanium-based material 10 includes the titanium base material 11, the rolling-altered layer 12 and the amorphous carbon film 13. The rolling-altered layer 12 includes titanium carbide and is formed on the surface of the base material 11. The amorphous carbon film 13 is formed on the surface of the rolling-altered layer 12.

The thus configured rolling-altered layer 12 serves as an intermediate layer that includes titanium carbide between the base material 11 and the amorphous carbon film 13, so the rolling-altered layer 12 has an affinity for carbon in the amorphous carbon film 13. Furthermore, as shown in FIG. 2, because of asperities of the surface of the rolling-altered layer 12 (interface between the rolling-altered layer 12 and the amorphous carbon film 13), it is possible to exhibit anchor effect to the amorphous carbon film 13. In addition, the rolling-altered layer 12 is a layer that part of the base material 11 is altered, so the adhesion of the rolling-altered layer 12 to the base material 11 is also high.

Furthermore, the rolling-altered layer 12 is incidentally formed at the time of rolling for regulating the thickness of the base material 11, so no additional manufacturing cost is required for forming an intermediate layer as an adhesive layer.

Hereinafter, the embodiment of the invention will be described using Examples.

Example 1

First, a base material made of titanium having a thickness of 300 mm was prepared. Dairoll (Daido Chemical Industry Co., Ltd.) was used as a rolling oil that includes carbon (rolling oil with additive agent that includes carbon), and the titanium base material heated to 800° C. was subjected to hot rolling by rolling rollers at a rolling force of 8×108 Pa (stress) until the titanium base material has a thickness of 0.2 mm to thereby form a rolling-altered layer on the surface of the base material.

Subsequently, the rolling-altered layer was measured by X-ray diffraction (XRD) to confirm that titanium carbide is included in the rolling-altered layer. Then, an amorphous carbon film was formed on the surface of the rolling-altered layer by plasma CVD.

Specifically, first, the base material was put into a plasma CVD device, and gas in the chamber was exhausted by a pump to evacuate the inside of the chamber. After that, hydrogen gas and argon gas were introduced into the chamber through a gas introducing pipe. Specifically, 30 sccm of hydrogen gas and 30 sccm of argon gas were introduced to attain a gas pressure of about 450 Pa. Thereafter, as direct-current voltage was applied between a stainless steel anode plate and a base that were placed inside the chamber, electrical discharge was started. In the following Examples, and the like, 400 V direct-current voltage was applied to increase the temperature of the base material to a predetermined deposition temperature by ion bombardment. Then, 30 ccm benzene gas was introduced as reaction gas through the gas introducing pipe in addition to hydrogen gas and argon gas. After that, as predetermined electric power was applied between the stainless steel anode plate and the base that were placed inside the chamber, electrical discharge was started to deposit an amorphous carbon film having a thickness of 1 μm on the surface of the rolling-altered layer, thus manufacturing a test piece of the titanium-based material.

Evaluation Method

Contact Resistance Test

Figure 3:
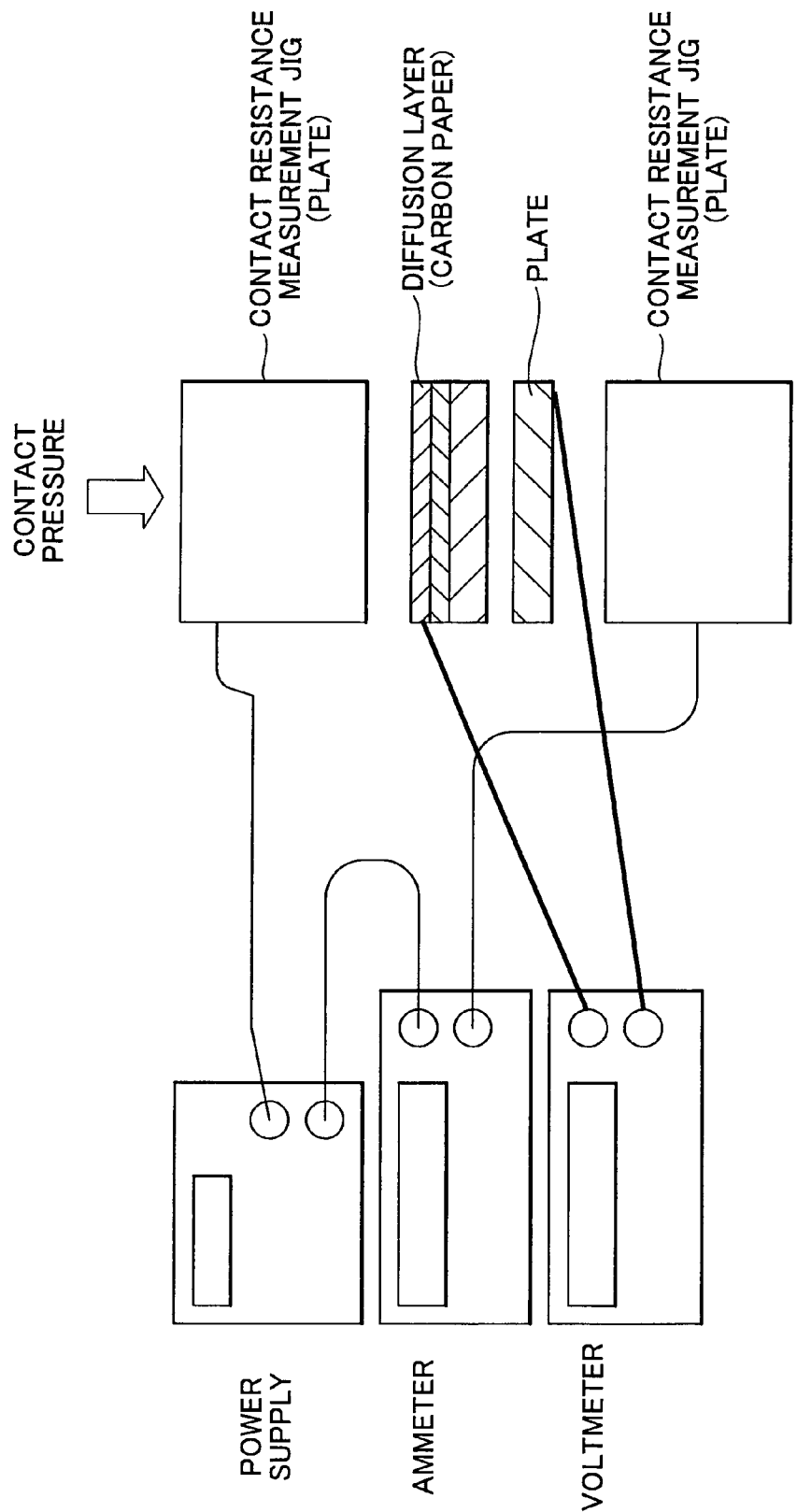
FIG. 3 is a schematic view of a system for contact resistance test.

The test piece of the titanium-based material was subjected to contact resistance test. As shown in FIG. 3, carbon paper (thickness 0.5 mm) corresponding to a diffusion layer of a fuel cell was placed on the surface of the test piece amorphous carbon film, the amorphous carbon film was placed between the carbon paper and the titanium-based material (carbon film), and then measurement was made while applying a constant load (1 MPa). In this state, current from a power supply was regulated so that the current flowing through the titanium-based material is 1 A using an ammeter, and the voltage applied to the test piece was measured by a voltmeter. Thus, the contact resistance between the amorphous carbon film and the carbon paper was calculated. The contact resistance test shown in FIG. 3 was conducted one by one before and after constant-potential corrosion test shown in FIG. 4, which will be described later. The evaluation area of the test piece in the contact resistance test is 4 cm$^2$ (2 cm×2 cm).

Note that, in order to measure only the contact resistance between the amorphous carbon film and the carbon paper, a thick (1 μm) Au-plated SUS was brought into contact with the other surface (non-deposited surface) of the titanium-based material to thereby prevent occurrence of contact resistance between the other surface and the Au-plated SUS.

Constant-Potential Corrosion Test

Figure 4:
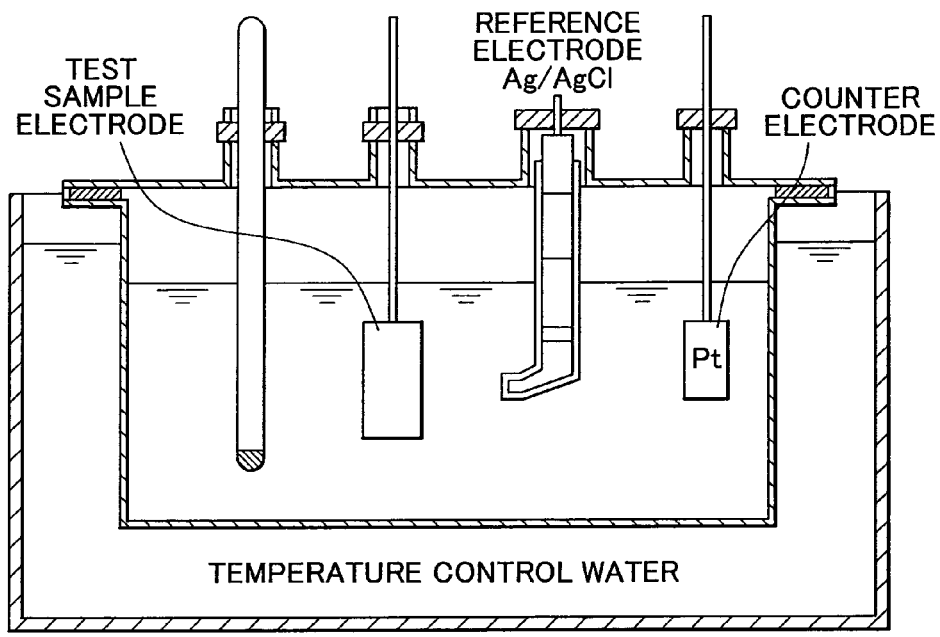
FIG. 4 is a schematic view of a system for constant-potential corrosion test.
Figure 5:
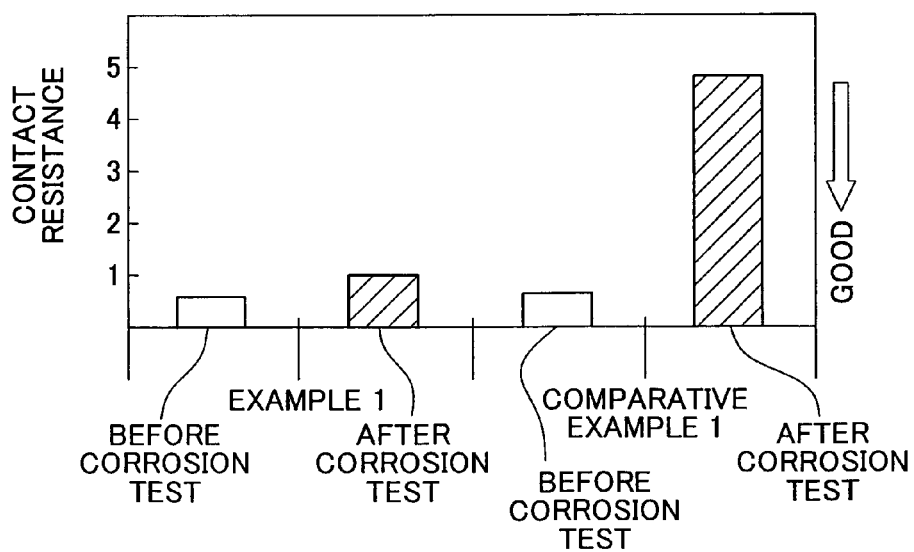
FIG. 5 is a graph that shows changes in contact resistances of test pieces before and after being subjected to constant-potential corrosion test according to Example 1 and Comparative example 1.
Figure 6A:
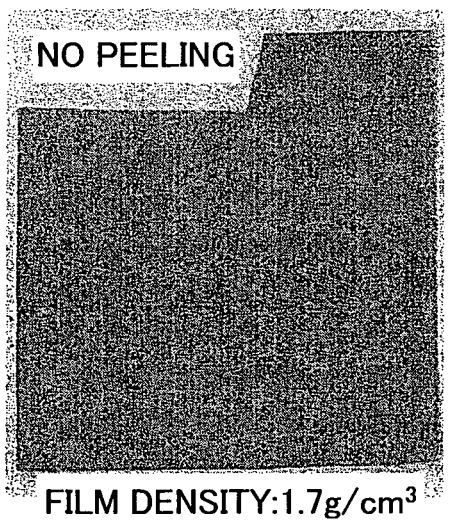

The test piece of the titanium-based material was subjected to constant-potential corrosion test in compliance with a method for high-temperature electrochemical corrosion test (JISZ2294) of metal materials of Japanese Industrial Standards. As shown in FIG. 4, in an open-air system, the test piece, of which the temperature was adjusted to 50° C. using temperature control water, was immersed in sulfuric acid solution (300 ml, pH4). In this state, a counter electrode formed of a platinum plate and the test piece (test sample electrode) were electrically connected to generate 1.0 V potential difference between the counter electrode and the test sample electrode to thereby cause the test piece to corrode. Note that the potential of the test piece was maintained at constant using a reference electrode. In addition, a test duration was set at about 50 hours. FIG. 5 shows a change in contact resistance of the test piece before and after being subjected to constant-potential corrosion test. Note that FIG. 5 is a graph that is normalized in such a manner that the contact resistance value after corrosion test is set at 1.0. In addition, the surface of the amorphous carbon film after being subjected to constant-potential corrosion test was observed by a microscope. FIG. 6A shows the photograph of the surface of the test piece after being subjected to constant-potential corrosion test.

Comparative Example 1

Figure 6B:
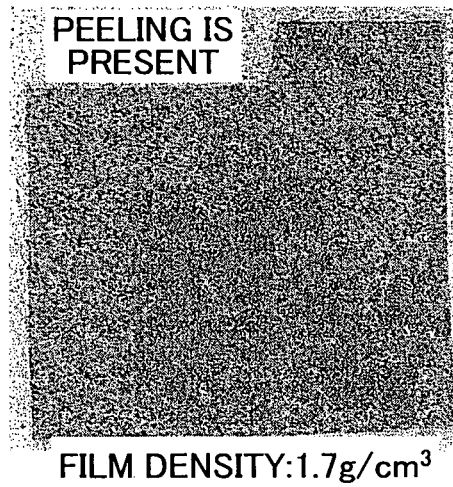

As in the case of Example 1, a test piece of the titanium-based material was manufactured. Comparative example 1 differs from Example 1 in that the rolling-altered layer after rolling was removed and then the amorphous carbon film was formed on the surface of the titanium base material from which the rolling-altered layer had been removed. Then, as in the case of Example 1, Comparative example 1 was subjected to contact resistance test, constant-potential corrosion test and microscopical observation. FIG. 5 shows a change in contact resistance of the test piece before and after being subjected to constant-potential corrosion test. In addition, FIG. 6B shows the photograph of the surface of the test piece after being subjected to constant-potential corrosion test.

Result 1

As shown in FIG. 5, the contact resistance of Example 1 after being subjected to corrosion test is lower than that of Comparative example 1, and the contact resistance of Example 1 after being subjected to corrosion test remains almost unchanged. In addition, as shown in FIG. 6A and FIG. 6B, in Example 1, no peeling of the amorphous carbon film was observed after being subjected to constant-potential corrosion test; whereas, in Comparative example 1, peeling of the amorphous carbon film was observed after being subjected to constant-potential corrosion test. According to the above results, it is presumable that, in Example 1, the adhesion of the amorphous carbon film was improved because of the rolling-altered layer provided between the titanium base material and the amorphous carbon film, and it is presumable that the titanium-based material of Example 1 has high anti-corrosion property than that of Comparative example 1.

Example 2

As in the case of Example 1, a test piece of the titanium-based material was manufactured. Example 2 differs from Example 1 in that the temperature during deposition was changed to cause the bulk density of the amorphous carbon film to fall within the range of 1.6 g/cm$^3$ to 2.2 g/cm$^3$ (bulk density). Note that, when the bulk density of the amorphous carbon film was set at 1.6 g/cm$^3$, the deposition temperature was set at 600° C. as a deposition condition; when the bulk density of the amorphous carbon film was set at 2.2 g/cm$^3$, the deposition temperature was set at 400° C.

Then, these test pieces were subjected to contact resistance test and constant-potential corrosion test as in the case of Example 1. Changes in contact resistance of each test piece after being subjected to constant-potential corrosion test are shown. Note that the cross sections of the test pieces before and after being subjected to constant-potential corrosion test were observed by a scanning electron microscope. FIG. 8A shows the photograph of the cross section of the titanium-based material, of which the bulk density of the amorphous carbon film is 1.7 g/cm$^3$, before being subjected to constant-potential corrosion test. FIG. 8B shows the photograph of the cross section of the titanium-based material, of which the bulk density of the amorphous carbon film is 1.7 g/cm$^3$, after being subjected to constant-potential corrosion test. FIG. 8A and FIG. 8B also indicate the respective contact resistances at this time. Note that the mass of the base material before and after depositing the amorphous carbon film was measured to calculate the mass of the amorphous carbon film, the thickness of the amorphous carbon film was measured from the surface area of the amorphous carbon film and the thickness measured by SEM, and then the bulk density of the amorphous carbon film was measured on the basis of these results.

Comparative Example 2

Figures 9A, 9B:
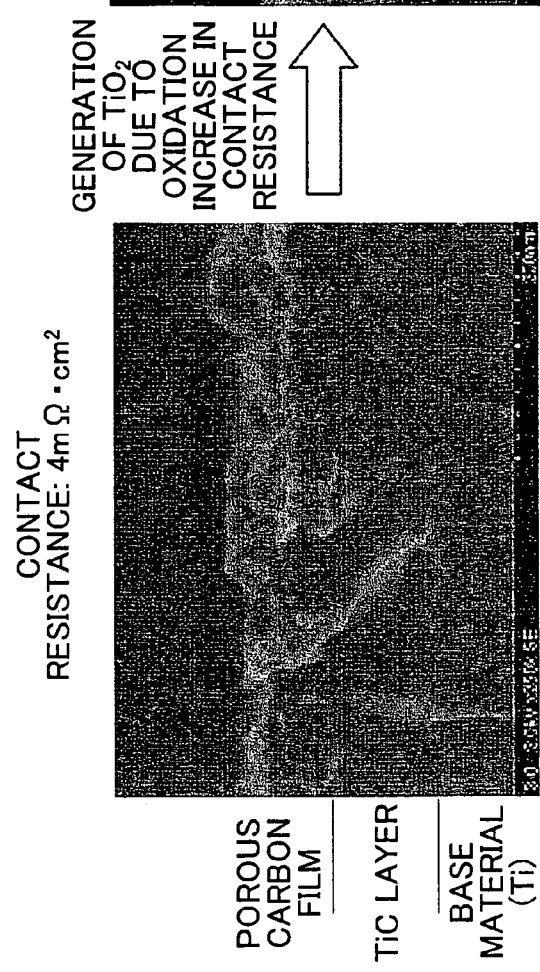
FIG. 9A shows a photograph of the cross section of a titanium-based material having a bulk density of 0.8 g/cm$^3$ of an amorphous carbon film before being subjected to constant-potential corrosion test according to Comparative example 2.
FIG. 9B is a photograph of the cross-section of the titanium-based material after being subjected to constant-potential corrosion test.
Figure 10:
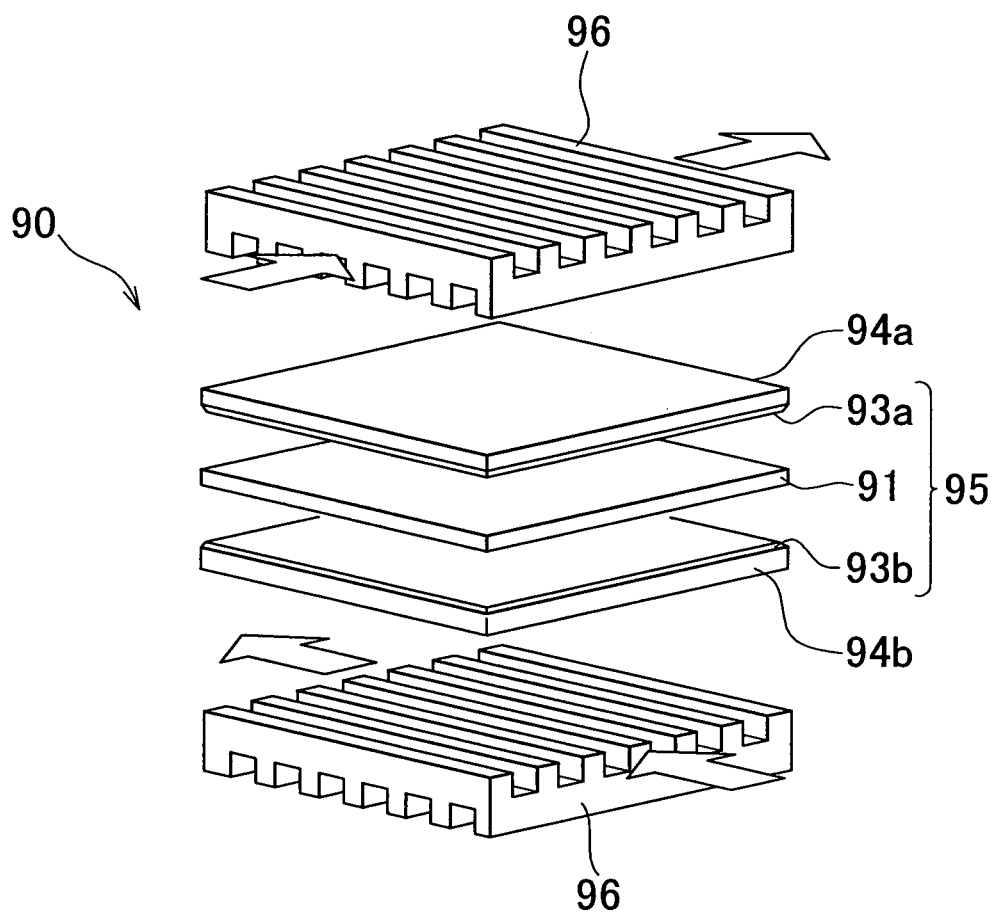
FIG. 10 is a schematic view that illustrates an example of a polymer electrolyte fuel cell (single cell).

As in the case of Example 2, plasma CVD was used at a temperature that exceeds 600° C., and, in arc ion plating (AIP), a carbon target was used to perform deposition at an arc current of 50 A and a bias voltage of −120 V. Comparative example 2 differs from Example 2 in that the bulk density of the former amorphous carbon film was set to fall within the range below 1.6 g/cm$^3$, and the bulk density of the latter amorphous carbon film was set to fall within the range above 2.2 g/cm$^3$. As in the case of Example 2, changes in contact resistance of each test piece after being subjected to constant-potential corrosion test are shown. Note that the cross sections of the test pieces before and after being subjected to constant-potential corrosion test were observed by a scanning electron microscope. FIG. 9A shows the photograph of the cross section of the titanium-based material, of which the bulk density of the amorphous carbon film is 0.8 g/cm$^3$, before being subjected to constant-potential corrosion test. FIG. 9B shows the photograph of the cross section of the titanium-based material, of which the bulk density of the amorphous carbon film is 0.8 g/cm$^3$, after being subjected to constant-potential corrosion test. FIG. 9A and FIG. 9B also indicate the respective contact resistances at this time.

Result 2

Figure 7:
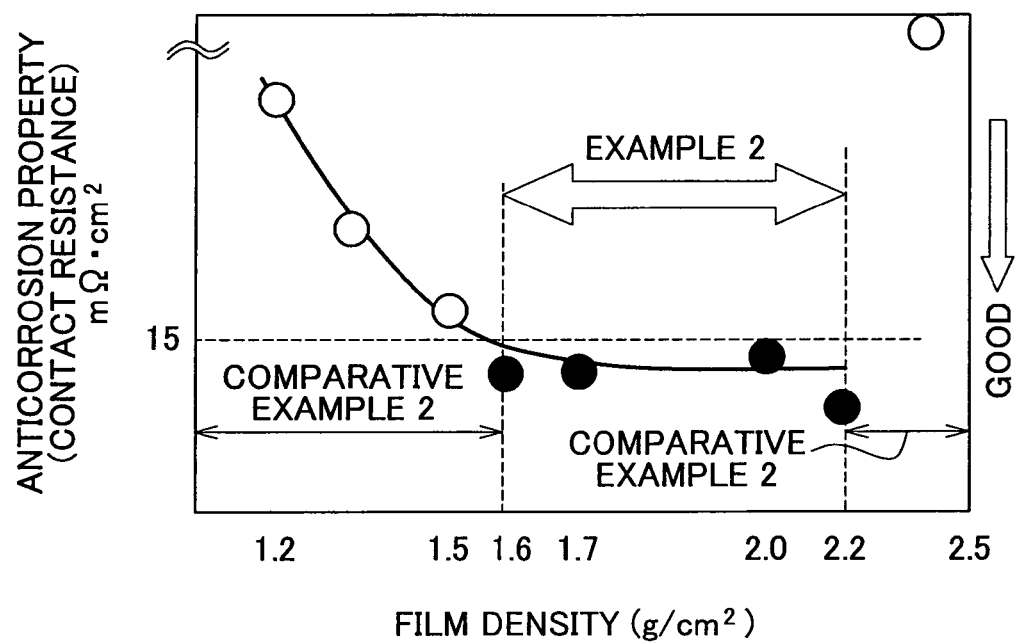
FIG. 7 is a graph that shows the contact resistances of test pieces after being subjected to constant-potential corrosion test according to Example 2 and Comparative example 2.

As shown in FIG. 7, when the bulk density of the amorphous carbon film of Comparative example 2 was lower than 1.6 g/cm$^3$, the contact resistance increased as the bulk density decreased. In addition, when the bulk density of the amorphous carbon film of Comparative example 2 exceeded 2.2 g/cm$^3$, the contact resistance increased as the bulk density increased. Furthermore, the contact resistance of the carbon film of Example 2 of which the bulk density ranges from 1.6 g/cm$^3$ to 2.2 g/cm$^3$ was lower than or equal to 15 mΩ·cm$^2$.

As shown in FIG. 8A and FIG. 8B, the cross section of the test piece of Example 2 remained almost unchanged before and after being subjected to constant-potential corrosion test, no corrosion was observed, and there was no change in contact resistance. On the other hand, as shown in FIG. 9A and FIG. 9B, the 0.8 g/cm$^3$ carbon film of Comparative example 2 had a porous structure before being subjected to constant-potential corrosion test. After being subjected to constant-potential corrosion test, a titanium oxide film was formed between the carbon film and the titanium carbide film, a titanium oxide film was also formed on the surface of the carbon film, and the contact resistance increased by about 50 times.

According to these results, it is presumable that, when the bulk density of the amorphous carbon film is lower than 1.6 g/cm$^3$, the base material easily corrodes because of the porous structure of the carbon film, and it is presumable that, when the bulk density of the carbon film exceeds 2.2 g/cm$^3$, the structure of the carbon film is approximate to a diamond structure and, therefore, the contact resistance increases. For the above reason, when such a titanium-based material is used under corrosive environment, the bulk density of the amorphous carbon film more desirably ranges from 1.6 g/cm$^3$ to 2.2 g/cm$^3$.

The embodiment of the invention is described in detail above; however, a specific configuration is not limited to the embodiment. The aspect of the invention also encompasses design changes without departing from the scope of the invention.

For example, in the present embodiment, the amorphous carbon film is deposited. However, when electrical conductivity is required, it is only necessary that the carbon film includes sp2 carbon; when only adhesion is required, the carbon film may be formed of only sp3 carbon. The type of the carbon film is not limited to the amorphous carbon film. Furthermore, in the embodiment, the bulk density of the amorphous carbon film is regulated by changing the deposition condition of plasma CVD. Of course, for example, the bulk density of the carbon film during deposition may be regulated by PVD, such as plasma PVD and ion plating.

The invention claimed is:

1. A method of manufacturing a fuel cell separator made of a titanium-based material, comprising:
   rolling a titanium base material via rolling oil that includes carbon to form a rolling-altered layer that includes titanium carbide on a surface of the base material during the rolling, wherein during the rolling the titanium base material is heated to 800° C. and is subjected to hot rolling; and
   depositing a carbon film on the surface on which the rolling-altered layer has been formed so that the bulk density of the carbon film ranges from 1.6 g/cm$^3$ to 2.2 g/cm$^3$ and a contact resistance between the carbon film and carbon paper is lower than or equal to 15 mΩ·cm$^2$ when the carbon film and the carbon paper are pressed at a contact pressure of 1 MPa.

2. The method of claim 1, wherein the carbon film is deposited by plasma CVD.

3. The method of claim 1, wherein the surface of the base material contacts with an electrode of a fuel cell.

* * * * *